(12) United States Patent
Estrada et al.

(10) Patent No.: US 11,792,933 B2
(45) Date of Patent: Oct. 17, 2023

(54) CONNECTOR INTERFACE ASSEMBLY FOR ENCLOSED VESSELS AND ASSOCIATED SYSTEMS AND METHODS

(71) Applicant: Fermi Research Alliance, LLC, Batavia, IL (US)

(72) Inventors: Juan Estrada, Geneva, IL (US); Guillermo Fernandez Moroni, Batavia, IL (US); Andrew G. Lathrop, Bristol, IL (US); Javier Tiffenberg, Chicago, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 252 days.

(21) Appl. No.: 17/389,306

(22) Filed: Jul. 29, 2021

(65) Prior Publication Data
US 2023/0030912 A1 Feb. 2, 2023

(51) Int. Cl.
*H05K 1/18* (2006.01)
*H01R 43/26* (2006.01)
*H05K 1/02* (2006.01)
*H01R 43/20* (2006.01)
*H05K 3/28* (2006.01)
(Continued)

(52) U.S. Cl.
CPC ............ *H05K 1/18* (2013.01); *H01R 43/205* (2013.01); *H01R 43/26* (2013.01); *H05K 1/0216* (2013.01); *H05K 3/282* (2013.01); *H01R 13/6215* (2013.01); *H05K 3/02* (2013.01); *H05K 2201/0715* (2013.01); *H05K 2201/09063* (2013.01); *H05K 2201/09227* (2013.01); *H05K 2201/10189* (2013.01); *H05K 2201/10507* (2013.01)

(58) Field of Classification Search
CPC ........ H05K 1/18; H05K 1/0216; H05K 3/282; H05K 2201/0715; H05K 2201/09063; H01R 43/205; H01R 13/6215; H01R 43/26
USPC ....................................................... 439/55
See application file for complete search history.

(56) References Cited

U.S. PATENT DOCUMENTS 5,044,053 A * 9/1991 Kopel .................. B06B 1/0622
29/25.35
5,148,103 A * 9/1992 Pasiecznik, Jr. ...... G01R 1/0735
324/754.16
(Continued)

*Primary Examiner* — Alexander Gilman
(74) *Attorney, Agent, or Firm* — Grable Martin PLLC; William A. Harding

(57) ABSTRACT

Systems, methods, and apparatus that employ a connector assembly having a substrate layer with an inner aperture and an outer periphery, and one or more signal traces disposed on the substrate that extend from an inner first location to an outer second location of the apparatus, for communicating data between electronic devices positioned within an interior volume of an enclosed vessel and complementary electronic devices positioned in an ambient environment external to the enclosed vessel. An inner connector is conductively connected the signal traces at the inner first location of each signal trace, and an outer connector is conductively connected to the one or more signal traces at the outer second location of each signal trace. A substantially flat exterior surface extends radially over at least a portion of a region between the respective first locations and the respective second locations.

20 Claims, 13 Drawing Sheets

(51) Int. Cl.
  *H05K 3/02*    (2006.01)
  *H01R 13/621*  (2006.01)

(56) References Cited

U.S. PATENT DOCUMENTS

| | | | | |
|---|---|---|---|---|
| 6,853,205 | B1* | 2/2005 | Cheng | G01R 1/07342 |
| | | | | 324/755.05 |
| 7,259,549 | B2* | 8/2007 | Weinraub | G01R 1/18 |
| | | | | 324/756.07 |
| 8,674,715 | B2* | 3/2014 | Root | G01R 3/00 |
| | | | | 324/754.07 |
| 9,310,255 | B2* | 4/2016 | Kuo | H05K 7/20209 |
| 9,605,983 | B2* | 3/2017 | Ausserlechner | G01R 33/0047 |
| 10,485,092 | B2* | 11/2019 | Schneider | H05K 3/429 |
| 10,649,505 | B2* | 5/2020 | Schnell | G06F 1/185 |
| 10,840,196 | B1* | 11/2020 | Geyik | H01L 23/49838 |
| 11,275,106 | B2* | 3/2022 | Schultz | G01R 1/07364 |
| 2004/0224560 | A1* | 11/2004 | Kosmala | H01R 13/7195 |
| | | | | 439/620.11 |
| 2015/0354999 | A1* | 12/2015 | Ausserlechner | G01D 11/305 |
| | | | | 73/866.5 |
| 2020/0214157 | A1* | 7/2020 | Solomon | H05K 5/0069 |
| 2022/0401858 | A1* | 12/2022 | Steele | C12M 29/04 |
| 2023/0030912 | A1* | 2/2023 | Estrada | H05K 1/18 |

* cited by examiner

CONNECTOR INTERFACE ASSEMBLY FOR ENCLOSED VESSELS AND ASSOCIATED SYSTEMS AND METHODS

STATEMENT REGARDING FEDERALLY SPONSORED RESEARCH OR DEVELOPMENT

The invention described in this patent application was made with Government support under the Fermi Research Alliance, LLC, Contract Number DE-AC02-07CH11359 awarded by the U.S. Department of Energy. The Government has certain rights in the invention.

FIELD OF THE INVENTION

The present invention relates generally to connector technology for enclosed vessels. More particularly, this invention pertains to devices, systems, and associated methods for communicating data between the interior and exterior of an enclosed and/or sealed vessel.

BACKGROUND OF THE INVENTION

Pressure vessels are broadly used in scientific instruments and in various industries for a wide range of purposes. In many cases, control and/or sensor signal interfaces are required to connect the pressurized volume inside of a vessel with equipment placed outside the vessel.

Depending on the intended use of a pressure vessel, there may be a desire to communicate with sensors or other components inside the pressure vessel. For example, a pressure sensor or a temperature sensor inside the pressure vessel can be used to accurately detect pressure or temperature conditions inside the pressure vessel. Such sensors may send signals to control circuitry, a data recorder, and/or a display device outside of the pressure sensor. Other types of components may also be inserted into the pressure vessel, such as controllers, processing equipment, cameras, and/or any other type of equipment. Feed-through connector solutions may allow such equipment to communicate with other components outside of the pressure vessel. Feed-through connectors may also be used for other types of vessels, pipes, or other containment equipment that isolates an internal volume from an external atmosphere.

Typically, such connections involve custom-made feed-through connectors that are expensive and prone to leaks. Such connections offer a limited density of connectors, and the availability of different types of connectors is also limited.

Accordingly, a need exists for a solution to at least one of the aforementioned challenges in connecting components inside of a sealed vessel with control or monitoring equipment or other components outside of the vessel. For instance, there is a need for an easy-to-manufacture pass-through connector that provides a high density of connectors, that reliably avoids leaks, and that has a flexible design in terms of the types of connectors and dimensions of vessels into which the connector is installed.

As used herein, the term "vessel" can refer to any type of structure in which an interior volume is isolated from an ambient environment. Thus, vessels can include storage tanks, reaction chambers, compression tanks, distillation towers, vessels for performing experiments, reservoirs (e.g., hydraulic or pneumatic), wearable suits (e.g., diving, hazmat, or space suits), or pipes, to name a few examples.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention relate to a pass-through connector designed to be inserted between gaskets of a vessel and vessel attachment. The structure and construction of the pass-through connector facilitate forming a seal to prevent leaks while providing electrically conductive pathways between the exterior of the vessel and the interior volume of the vessel. The pass-through connector may have electrical contacts and/or connectors in the interior volume that are conductively connected to the contacts and/or connectors on the exterior of the vessel. The pass-through connector may be constructed using printed circuit board techniques to define the conductive pathways through a solid ring and/or other structure that surrounds an inner aperture of the pass-through connector. When installed between a flange connector of the vessel and a corresponding flange connector of a vessel attachment, the aperture may form part of the interior volume of the vessel and vessel attachment. Sensors and/or other components in the volume may communicate with equipment outside of the vessel through the conductive pathways of the pass-through connector.

In a first embodiment of the present invention, a connector assembly may include a substrate layer having a first side, a second side, an inner aperture and an outer periphery outwardly disposed relative to the inner aperture. One or more signal traces may be disposed on the substrate, with each signal trace extending at least from a corresponding first location to a corresponding second location. The second location may be outwardly disposed relative to the first location. An inner connector may be conductively connected to at least one of the one or more signal traces at the first location of each signal trace. An outer connector may be conductively connected to at least one of the one or more signal traces at the second location of each signal trace. A first substantially flat exterior surface may be disposed on the substrate and may extend radially over at least a portion of a region between the respective first locations and the respective second locations on the first side of the substrate layer. A second substantially flat exterior surface may be disposed on the substrate and may extend radially over at least a portion of a region between the respective first locations and the respective second locations on the second side of the substrate layer.

Implementations of certain assembly aspect(s) of the present invention may include one or more of the following features. One or more non-conductive epoxy layers may encapsulate the one or more signal traces. A first substantially flat hard layer may be disposed radially between the respective first locations and the respective second locations on the first side of the substrate layer. A first non-conductive epoxy layer of the one or more the non-conductive epoxy layers may be disposed between the substrate layer and the first substantially flat hard layer. A second substantially flat hard layer may be disposed radially between the respective first locations and the respective second locations on the second side of the substrate layer. The substrate layer may be disposed between the first non-conductive epoxy layer and the second substantially flat hard layer. The first substantially flat hard layer may comprise the first substantially flat exterior surface. An inner raised lip may project from the first substantially flat exterior surface and surrounding the inner aperture. An outer raised lip may project from the first substantially flat exterior surface and outwardly disposed relative to the inner raised lip. The inner raised lip and the outer raised lip may project from the first substantially flat exterior surface in a substantially axial direction. The first substantially flat hard layer and the second substantially flat hard layer may include a second inner aperture larger than the inner aperture of the substrate layer and a second outer periphery smaller than the outer periphery of the substrate layer, such that a first portion of the substrate layer may extend inwardly beyond an inner extent of the second inner aperture and a second portion of the substrate layer may extend outwardly beyond an outer extent of the second outer periphery. The first location of each of the one or more signal traces may be disposed on the first portion of the substrate layer. The second location of each of the one or more signal traces may be disposed on the second portion of the substrate layer. The inner connector may be mounted on the first portion of the substrate layer, and the outer connector may be mounted on the second portion of the substrate layer. The one or more signal traces may comprise a plurality of signal traces disposed on the first side of the substrate and a plurality of signal traces disposed on the second side of the substrate. A plurality of apertures may be outwardly disposed from the inner aperture, with each of the plurality of apertures adapted to allow passage of a fastener through a portion of the connector assembly. The inner connector and the outer connector each may comprise a multipin connector having a plurality of pins, with each pin conductively connected to a corresponding signal trace. The substrate layer, the one or more signal traces, the first substantially flat exterior surface, and the second substantially flat exterior surface may comprise a printed circuit board. The connector assembly may be adapted to be mounted between flanges of an enclosed vessel to provide a seal between an internal volume of the enclosed vessel and an exterior atmosphere of the enclosed vessel and to facilitate communication through the one or more signal traces between one or more components inside the enclosed vessel and one or more components outside of the enclosed vessel.

In accordance with additional aspects of the present invention, a system may include a pressure vessel having an interior, an exterior, and a first flange connector having a flange face and an aperture; a second flange connector having a flange face and an aperture; and a connector assembly. The connector assembly may include a substrate layer having a first side, a second side, an inner aperture and an outer periphery outwardly disposed relative to the inner aperture. One or more signal traces may be disposed on the substrate, with each signal trace extending at least from a corresponding first location to a corresponding second location. The second location may be outwardly disposed relative to the first location. An inner connector may be conductively connected to at least one of the one or more signal traces at the first location of each signal trace. An outer connector may be conductively connected to at least one of the one or more signal traces at the second location of each signal trace. A first substantially flat exterior surface may be disposed on the substrate and may extend radially over at least a portion of a region between the respective first locations and the respective second locations on the first side of the substrate layer. A second substantially flat exterior surface may be disposed on the substrate and may extend radially over at least a portion of a region between the respective first locations and the respective second locations on the second side of the substrate layer. A first gasket may be disposed between the first flange connector and the connector assembly. A second gasket may be disposed between the second flange connector and the connector assembly. The first flange connector may be connected to the second flange connector by one or more fasteners and the first flange connector, the first gasket, the connector assembly, the second gasket, and the second flange connector may form a seal between a volume defined at least in part by the interior of the pressure vessel, the aperture of the first flange connector, the inner aperture of the connector assembly, and the second flange connector.

Implementations of certain system aspect(s) of the present invention may include one or more of the following features. A first component may be positioned in the volume. A second component may be positioned in an external environment of the pressure vessel. The first component and the second component may be adapted to communicate using signals transmitted through the signal traces of the connector assembly.

In accordance with additional aspects of the present invention, a method of manufacturing a connector assembly may include fabricating a substrate layer having a first side, a second side, an inner aperture and an outer periphery outwardly disposed relative to the inner aperture; laminating a copper layer on the first side of the substrate layer; and etching one or more signal traces from the copper layer. Each signal trace may extend at least from a corresponding first location to a corresponding second location, wherein the second location may be outwardly disposed relative to the first location. A non-conductive epoxy layer may be applied over the one or more signal traces. A substantially flat first metal layer may be laminated over the non-conductive epoxy layer on the first side of the substrate layer. The first metal layer may extend radially over at least a portion of a region between the respective first locations and the respective second locations on the first side of the substrate layer. A substantially flat second metal layer may be laminated over the second side of the substrate layer. The second metal layer may extend radially over at least a portion of a region between the respective first locations and the respective second locations on the first side of the substrate layer. An inner connector may be conductively attached to at least one of the one or more signal traces at the first location of each signal trace. An outer connector may be conductively attached to at least one of the one or more signal traces at the second location of each signal trace.

Implementations of certain method aspect(s) of the present invention may include one or more of the following features. An inner raised lip projecting from the first substantially flat metal layer and encircling the inner aperture may be formed. An outer raised lip projecting from the first substantially metal layer and outwardly disposed relative to the inner raised lip may be formed. The inner raised lip and the outer raised lip may project from the first substantially flat metal layer in a substantially axial direction. A second copper layer may be laminated on the second side of the substrate layer. One or more signal traces may be etched from the second copper layer. Each signal trace may extend at least from a corresponding first location to a corresponding second location. The second location may be outwardly disposed relative to the first location. A second non-conductive epoxy layer may be applied over the one or more signal traces on the second side of the substrate layer. The substantially flat second metal layer on the second side of the substrate layer may be laminated over the second non-conductive epoxy layer.

In accordance with additional aspects of the present invention, a method of using an enclosed vessel may include inserting a connector assembly between a first flange connector of an enclosed vessel and a first gasket on a first side of the connector assembly and a second gasket and a second flange connector of an attachment to the enclosed vessel; connecting the first flange connector and the second flange connector by applying a sufficient axial force to create a seal between the first flange connector, the connector assembly, and the second flange connector using the first gasket and the second gasket and to isolate an interior volume of the enclosed vessel from an ambient environment; and sending signals between a device connected to the first connector inside of the enclosed vessel to a device connected to the second connector outside of the enclosed vessel. The connector assembly may include a substrate layer having a first side, a second side, an inner aperture and an outer periphery outwardly disposed relative to the inner aperture. One or more signal traces may be disposed on the substrate. Each signal trace may extend at least from a corresponding first location to a corresponding second location, wherein the second location may be outwardly disposed relative to the first location. An inner connector may be conductively connected to at least one of the one or more signal traces at the first location of each signal trace. An outer connector may be conductively connected to at least one of the one or more signal traces at the second location of each signal trace. A first substantially flat exterior surface may be disposed on the substrate and may extend radially over at least a portion of a region between the respective first locations and the respective second locations on the first side of the substrate layer. A second substantially flat exterior surface may be disposed on the substrate and may extend radially over at least a portion of a region between the respective first locations and the respective second locations on the second side of the substrate layer.

Implementations certain method aspect(s) of the present invention may include one or more of the following features. An internal volume of the enclosed vessel may be pressurized to a pressure different from the ambient environment.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. A person of ordinary skill in the art will also recognize that ordinal terms such as "first," "second,"

"third," etc. are used, in general, to distinguish different features, components, or aspects and do not necessarily connote a particular sequence or order, unless the context suggests that a sequence or order is intended (e.g., a first layer overlayed by a second layer placed on top of the first layer). The meaning of any of these terms is dependent upon the context within which it is used, and the meaning may be expressly modified.

Figure 1:
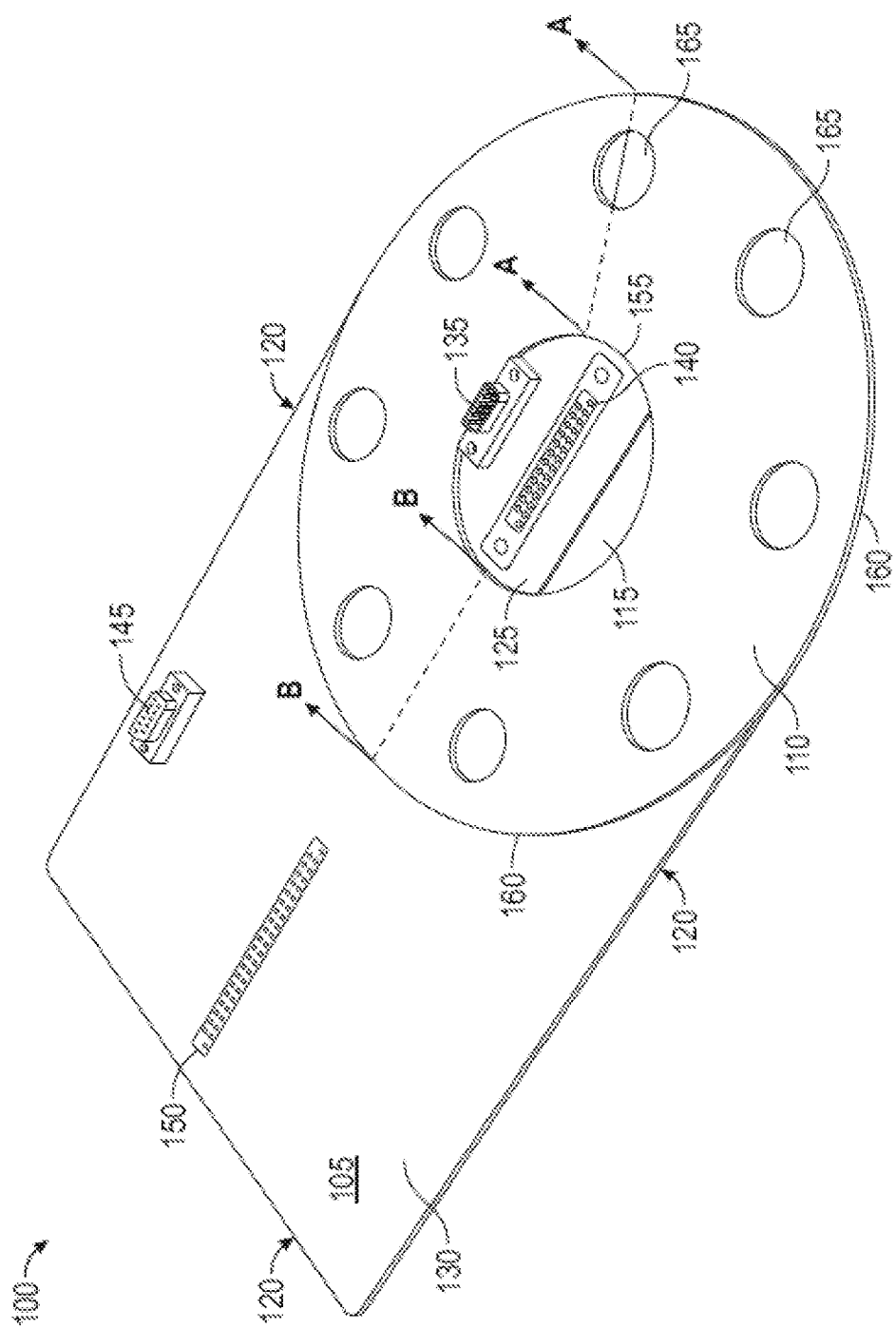
FIG. 1 is a perspective top view of a first exemplary pressure interface board assembly for enclosed vessels according to an embodiment of the present invention.
Figure 2:
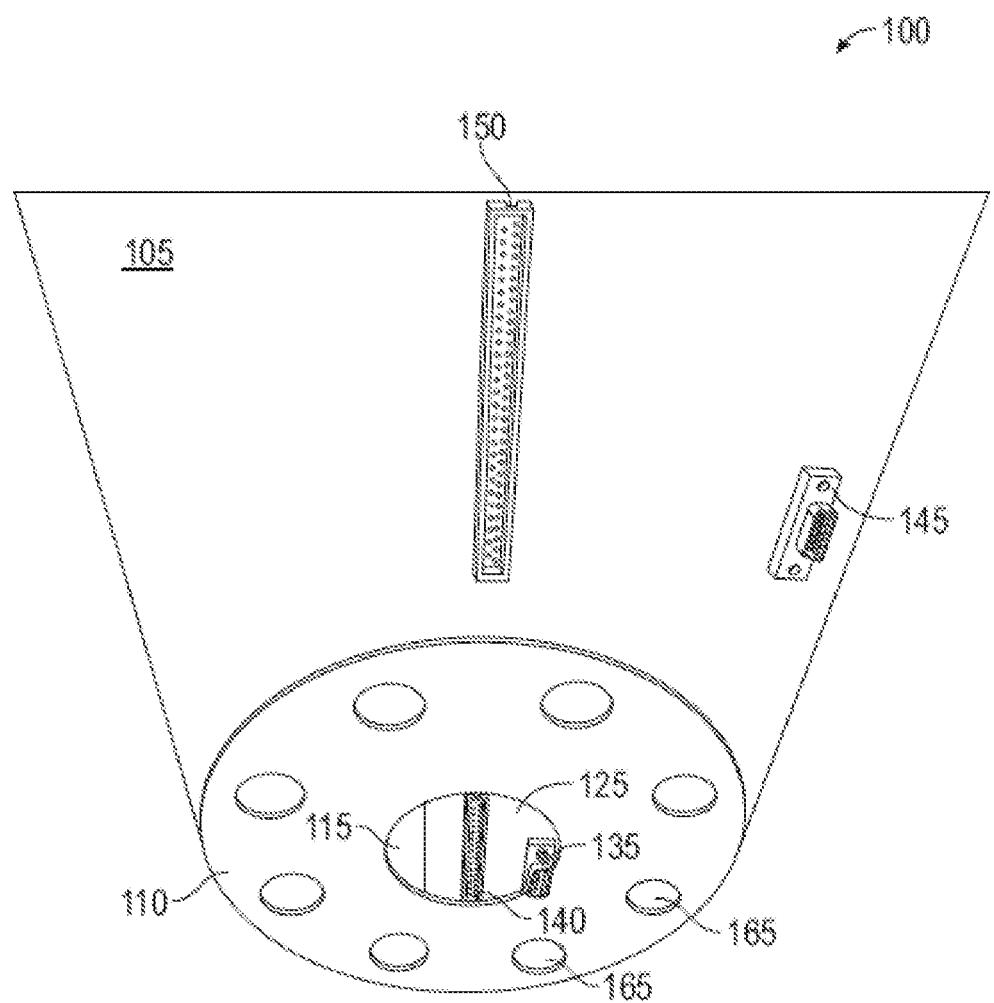
FIG. 2 is an upper perspective view of the first exemplary pressure interface board assembly of FIG. 1.

Referring initially to FIGS. 1 and 2, an exemplary implementation of a pressure interface board assembly 100 for use with an enclosed vessel according to an embodiment of the present invention will now be described in detail. Generally, the pressure interface board assembly 100 may be a printed circuit board (PCB) 105 encased in an epoxy material that protects internal signal traces (as shown and described in greater detail hereinbelow in relation to, for example, and without limitation, FIG. 9), with an external metal layer 110 that may present a flat, hard finish. As shown, PCB 105 is substantially planar and includes an inner aperture 115. The PCB 105 encloses the inner aperture 115 and extends outwardly in the substantially planar direction to an outer periphery 120. When assembled with an enclosed vessel (not shown in FIGS. 1 and 2), an inner portion 125 of the PCB 105 is adapted to be contained within an interior volume of the enclosed vessel, while an outer portion 130 of the PCB 105 is adapted to be located in an environment external to the enclosed vessel. A first inner connector 135 and a second inner connector 140 are mounted on the inner portion 125 of the PCB 105. A corresponding first outer connector 145 and a corresponding second outer connector 150 are mounted on the outer portion 130 of the PCB 105.

The flat, hard surface of the exterior metal layer 110 may provide a seal with, for example, and without limitation, one or more gaskets (not shown in FIGS. 1 and 2, but described hereinbelow) inserted between flanges of an enclosed vessel when the pressure interface board assembly 100 is inserted between the gaskets and the flanges. In certain embodiments, the pressure interface board assembly 100 may be constructed such that the exterior metal layer 110 is substantially flush with planar surfaces of the inner portion 125 and of the outer portion 130 of the PCB 105 (i.e., the exterior metal layer 110 and the inner portion 125 and the outer portion 130 of the PCB 105 have the same or substantially the same thickness). In alternative embodiments, the pressure interface board assembly 100 may be constructed such that the exterior metal layer 110 projects above a planar surface of the inner portion 125 and/or the outer portion 130 of the PCB 105. In still other embodiments, the pressure interface board assembly 100 may be constructed such that the surface of the inner portion 125 and/or the outer portion 130 of the PCB 105 are not planar and the thicknesses differ with respect to the exterior metal layer 130.

The exterior metal layer 110 includes a second inner aperture 155 that is larger, in the depicted embodiment, than the inner aperture 115 of the PCB 105. In this exemplary embodiment, the inner portion 125 of the PCB 105 fills a substantial portion of the second inner aperture 155 of the exterior metal layer 110, while the inner aperture 115 of the PCB 105 coincides with a portion of the second inner aperture 155 of the exterior metal layer 110 and allows passage of a volume of gas, liquid or other substances from one side of the pressure interface board assembly 100 to the other. In alternative embodiments, the inner aperture 115 of the PCB 105, the inner portion 125 of the PCB 105, and the second inner aperture 155 of the exterior metal layer 110 may be shaped differently. Generally, the PCB 105 may include an inner portion attached to a connector positioned within an inner aperture (e.g., the second inner aperture 155) of the pressure interface board assembly 100.

The exterior metal layer 110 also may include a second outer periphery 160 that is smaller, in the depicted embodiment, than the outer periphery 120 of the PCB 105. In this exemplary embodiment, the outer portion 130 of the PCB 105 extends beyond the second outer periphery 160 of the exterior metal layer 110. Although edges of the outer portion 130 of the PCB 105 are tangential to a circular exterior metal layer 110 in the depicted embodiment (such that the outer portion 130 projects in a single general direction from the exterior metal layer 110), the outer portion 130 of the PCB 105 can have any suitable size and shape for the desired application (e.g., the edges need not be tangential to the exterior metal layer, the outer portion 130 may have a different shape, and the outer portion 130 can project in more than one direction). As just one example, in some implementations, it may be desirable to have an outer portion 130 that projects both above and below a flange connector when installed on an enclosed vessel.

The second inner aperture 155 of the exterior metal layer 110 may be sized and shaped to correspond (precisely, substantially, or partially) to an inner dimension of an enclosed vessel (e.g., a pressure vessel that includes a 3-inch diameter pipe extension and class-300 flanges). In this manner, when the pressure interface board assembly 100 is installed on an enclosed vessel, the exterior metal layer 110 may provide a seal with the enclosed vessel, and the inner portion 125 of the PCB 105 may be exposed to, and contained within, the interior volume of the enclosed vessel. One or more inner connectors 135 and 140 may be used to connect to sensors or other components inside the enclosed vessel.

Likewise, the second outer periphery 160 of the exterior metal layer 110 may be sized and shaped to correspond (precisely, substantially, or partially) to an outer dimension of the enclosed vessel (e.g., an outer dimension of a flange connector on the enclosed vessel). The exterior metal layer 110 may not be circular in some implementations but may have any suitable size and shape (e.g., the exterior metal layer 110 may be shaped to correspond to, or to simply provide an adequate seal with, a non-circular gasket and flange assembly). In this manner, when the pressure interface board assembly 100 is installed on an enclosed vessel, the exterior metal layer 110 may provide a seal with the enclosed vessel, and the outer portion 130 of the PCB 105 may be exposed and accessible outside of the enclosed vessel. One or more outer connectors 145 and 150 may be used to connect to control systems or other equipment to receive signals from, or otherwise communicate with, sensors or other components connected to inner connectors 135 and 140 inside the enclosed vessel via signal traces internal to the PCB 105.

The PCB 105 and the exterior metal layer 110 further may include a plurality of connection apertures 165 located substantially adjacent to the second outer periphery 160 of the exterior metal layer 110. The connection apertures 165 are adapted to allow fasteners (e.g., bolts) to pass through the pressure interface board assembly 100. Such fasteners may be used, for example, and without limitation, to tightly clamp the pressure interface board assembly 100 between a pair of gaskets and a pair of flange connectors of an enclosed vessel to form a seal at the interface of the flange connectors. The connection apertures 165 may also help ensure proper positioning (e.g., centering) of the pressure interface board assembly 100 relative to the gaskets and the flange connectors as the fasteners are tightened. Any suitable number of connection apertures 165 may be used. In certain embodiments, connection apertures 165 may be omitted.

For purposes of this specification, the terms "exterior," "outer," and "outside" are generally interchangeable, as are the terms "interior," "inner", and "inside." In the context of the pressure interface board assembly 100 and for purposes of clarity in differentiation between directional references, however, the term "exterior" (e.g., as in "exterior layer" or "exterior surface") is generally used to refer layers of the PCB 105 and/or the pressure interface board assembly 100 that are at or nearer to a substantially planar surface of the PCB 105 and/or the pressure interface board assembly 100. The term "outer" (e.g., as in "outer periphery," "outer portion," or "outer connector") is generally used to refer to features or parts of the PCB 105 and/or pressure interface board assembly 100 that are distally positioned relative to the portion of the PCB 105 and/or pressure interface board assembly 100 designed to be in spatial contact with the inside of an enclosed vessel. Similarly, in the context of the pressure interface board assembly 100 and for purposes of clarity in differentiation between directional references, the term "interior" may generally be used to refer layers of the PCB 105 and/or the pressure interface board assembly 100 that contained farther within the PCB 105 and/or the pressure interface board assembly 100 and thus are relatively farther from a substantially planar surface of the PCB 105 and/or the pressure interface board assembly 100. The term "inner" (e.g., as in "inner aperture," "inner portion," or "inner connector") is generally used to refer to features or parts of the PCB 105 and/or pressure interface board assembly 100 that are designed to be in spatial contact with the inside of an enclosed vessel (i.e., the inner aperture 115 of the PCB 105 and/or the second inner aperture 155 of the exterior metal layer 110). It is noted that the terms "interior" and "exterior" may have similar meanings even if the surface of the pressure interface board assembly 100 is not substantially planar. In the context of an enclosed vessel, the terms "exterior" and "interior" are generally used to refer to the outside (e.g., ambient environment) and inside (e.g., interior volume), respectively, of the enclosed vessel.

Figure 3:
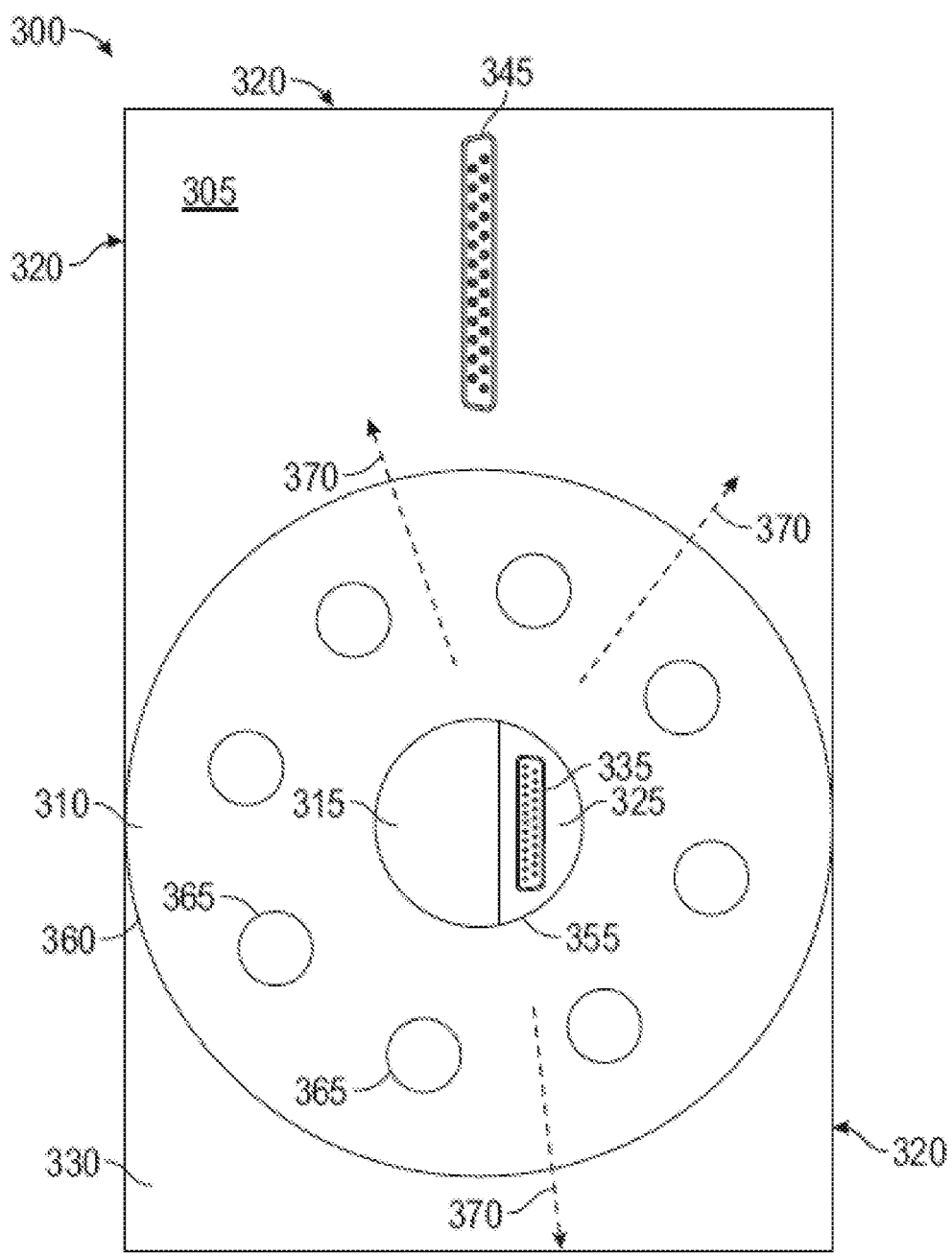
FIG. 3 is a front view of a second exemplary pressure interface board assembly for enclosed vessels according to an embodiment of the present invention.

FIG. 3 is a front view of an exemplary pressure interface board assembly 300. The pressure interface board assembly 300 may include a PCB 305 and a front-side exterior layer 310. The PCB 305, as shown, includes an inner aperture 315, an outer periphery 320, an inner portion 325, and an outer portion 330. The front-side exterior layer 310 has a hard, flat surface (e.g., adapted to form a tight seal with a gasket and/or flange), may be constructed of metal or another material, and may be part of the PCB 305 (e.g., by depositing material on the underlying layers of the PCB 305 through a PCB manufacturing process) or may be a separate component that is then laminated to the PCB 305. The PCB 305 and the front-side exterior layer 310 include a plurality of connection apertures 365. Thus, the pressure interface board assembly 300 is similar in many respects to the pressure interface board assembly 100 shown in FIGS. 1 and 2.

Compared to the pressure interface board assembly 100 shown in FIGS. 1 and 2, the pressure interface board assembly 300 of FIG. 3, however, includes a larger inner aperture 315 and a smaller inner portion 325 (relative to a size of a second inner aperture 355 of the front-side exterior layer 310), which may be desirable, for example, and without limitation, for improving flow through the inner aperture 315 if the pressure interface board assembly 300 is installed on a pipe that has is used in an application supporting a significant flow rate of gas, liquid, or other substance. In addition, the outer portion of the PCB 305 extends outwardly in two general directions beyond a second outer periphery 360 of the exterior layer 310 and inner aperture 315.

For purposes of this description, the term "outwardly" generally refers to a direction (e.g., as indicated by arrows 370) towards the outer periphery 320 of the PCB 305 and/or away from the general vicinity of the inner portion 325 and/or the inner aperture 315. The outward direction 370 may also be generally referred to as a radial direction, even if none of the components are circular (e.g., the outward direction 370 radiates from the inner portion 325 and/or the inner aperture 315 of the PCB 305, which may be surrounded by a portion of substantially the same thickness or otherwise constructed to facilitate forming a seal when installed between gaskets, flanges, or the like). The term "axial" generally refers to a direction that is substantially perpendicular to the outward or radial direction.

The pressure interface board assembly 300 further includes a first inner connector 335 mounted on the inner portion 325 of the PCB 305 and a first outer connector 345 mounted on the outer portion 330 of the PCB 305. The first inner connector 335 and the first outer connector 345 may be conductively connected by one or more signal traces interior to the PCB 305.

Figure 4:
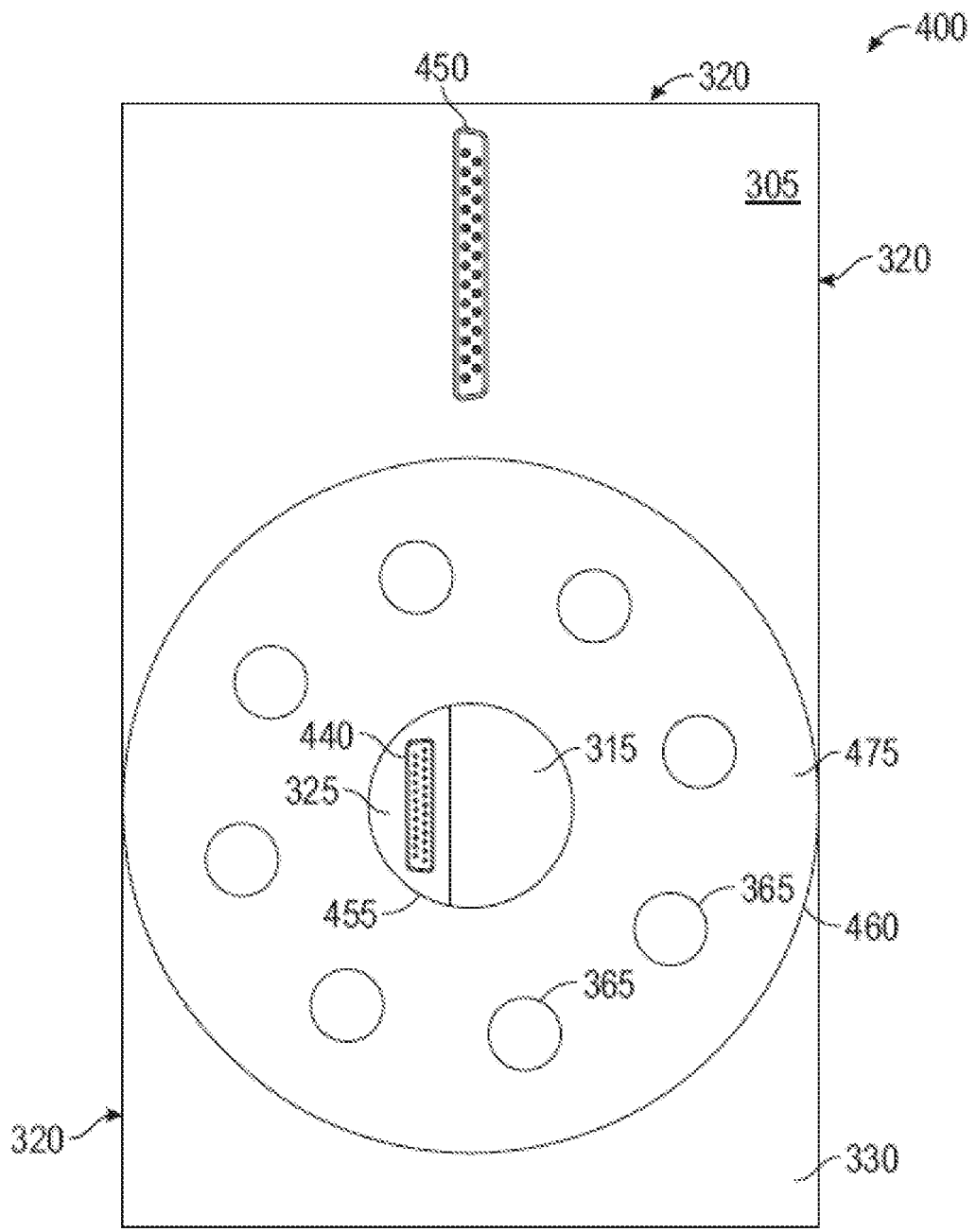
FIG. 4 is a back view of the second exemplary pressure interface board assembly of FIG. 3.

FIG. 4 is a back view of the pressure interface board assembly 300 of FIG. 3. A back-side exterior layer 475 is included as part of, or laminated on, the PCB 305. The inner aperture 315, the outer periphery 320, the inner portion 325, and the outer portion 330 of the PCB 305 and the plurality of connection apertures 365 are also shown from the back view. The back-side exterior layer 475 has a hard, flat surface (e.g., adapted to form a tight seal with a gasket and/or flange) and may be constructed of metal or another material.

The back side of the pressure interface board assembly 300 further includes a second inner connector 440 mounted on a back side of the inner portion 325 of the PCB 305 and a second outer connector 450 mounted on the back side of the outer portion 330 of the PCB 305. The second inner connector 440 and the second outer connector 450 may be conductively connected by one or more signal traces interior to the PCB 305. Each of the one or more signal traces connecting the first inner connector 335 and the first outer connector 345 and the one or more signal traces connecting the second inner connector 440 and the second outer connector 450 may be electrically isolated from one another to provide independent signal pathways between the respective first connectors 335 and 345 and second connectors 440 and 450.

As depicted in FIGS. 3 and 4, the dimensions of a second inner aperture 355 and a second outer periphery 360 of the front-side exterior layer 310 corresponds to the dimensions of a third inner aperture 455 and a third outer periphery 460 of the back-side exterior layer 475. The second inner aperture 355 of the front-side exterior layer 310 and the third inner aperture 455 of the back-side exterior layer 475 are larger in a radial direction than the inner aperture 315 of the PCB 305, and the second outer periphery 360 of the front-side exterior layer 310 and the third outer periphery 460 of the back-side exterior layer 475 are smaller in the radial direction than the outer periphery 320 of the PCB 305. In some implementations, the dimensions of the second inner aperture 355 and/or the second outer periphery 360 of the front-side exterior layer 310 may differ from the dimensions of the third inner aperture 455 and/or the third outer periphery 460 of the back-side exterior layer 475. In some implementations, the second outer periphery 360 of the front-side exterior layer 310 and/or the third outer periphery 460 of the back-side exterior layer 475 may coincide with the outer periphery 320 of the PCB 305. In such a case, the one or more signal traces may be electrically isolated by using a non-conductive material for the front-side exterior layer 310 and the back-side exterior layer 475 or otherwise insulating the signal traces where the signal traces connect to the connectors 335, 345, 440, and 450.

Figure 5:
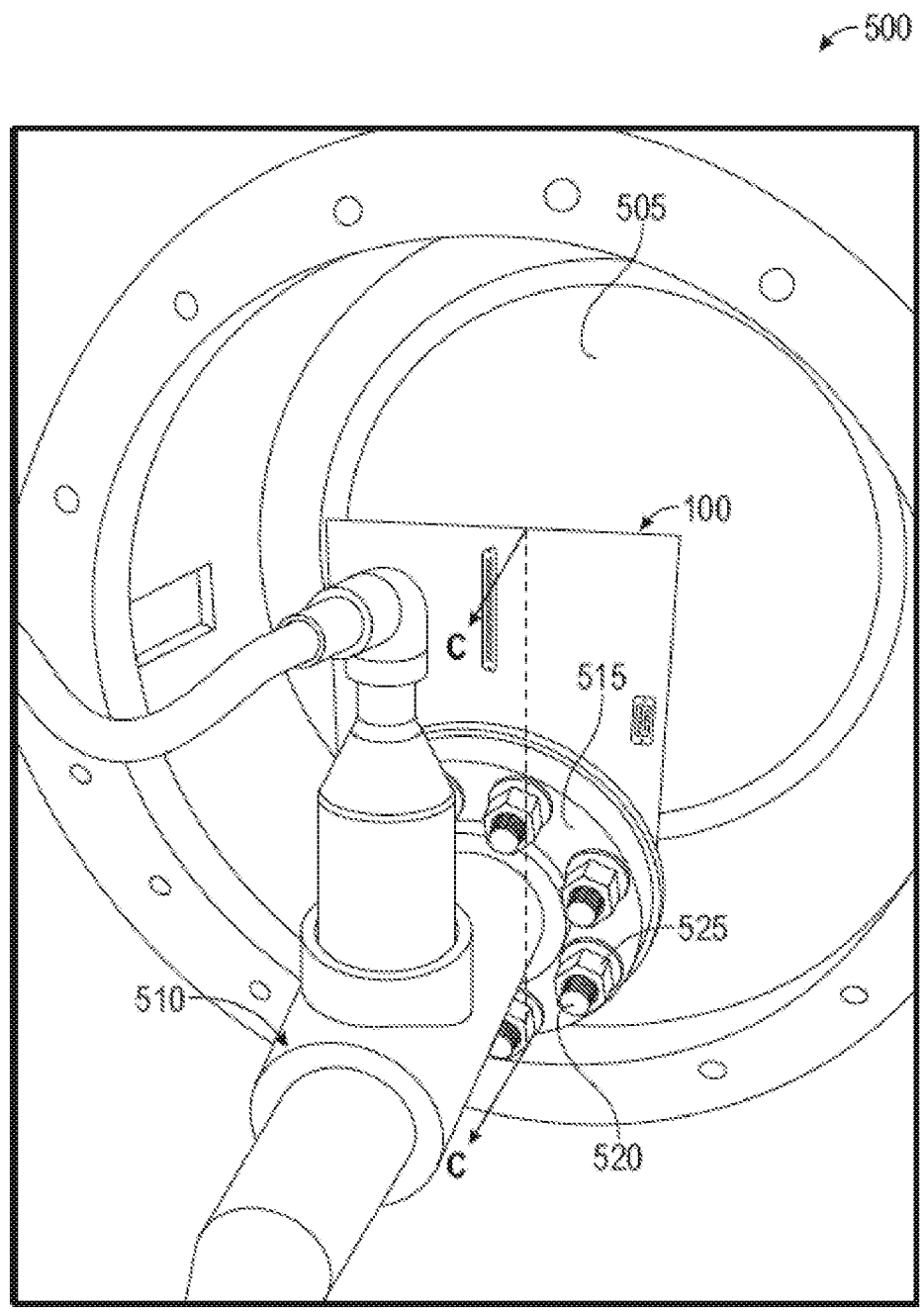
FIG. 5 is a perspective view of the first exemplary pressure interface board assembly of FIG. 1 installed on an exemplary pressure vessel.

FIG. 5 is a perspective view of the pressure interface board assembly 100 of FIG. 1 installed on an exemplary pressure vessel 500. The pressure vessel 500 includes a main chamber 505 and an attachment pipe 510 with a connector flange 515. In this example, a corresponding connector flange is attached to the main chamber 505 but is hidden from view behind the pressure interface board assembly 100. The pressure interface board assembly 100 is installed between the connector flange 515 of the attachment pipe 510 and the connector flange of the main chamber 505. Bolts 520 are inserted through receiving apertures in the respective connector flanges that correspond to the connection apertures 165 of the pressure interface board assembly 100 and through the connection apertures 165 and are tightened down by nuts 525 to thereby sandwich the pressure interface board assembly 100 between the connector flange 515 of the attachment pipe 510 and the connector flange of the main chamber. As a result, the inner portion 125 of the pressure interface board assembly 100 is contained within the interior volume of the main chamber 505 and the attachment pipe 510. To form a better seal, a gasket may also be inserted between the connector flange 515 of the attachment pipe 510 and the front side of the pressure interface board assembly 100, and another gasket may be inserted between the connector flange of the main chamber 505 and the back side of the pressure interface board assembly 100. When the nuts 525 are sufficiently tightened, the interior volume of the main chamber 505 and the attachment pipe 510 is sealed off from the exterior environment of the pressure chamber 500. For example, and without limitation, the seal may withstand internal pressures of 450 psi or more and negative pressures down to a total vacuum. In addition, the seal may withstand cryogenic temperatures, such as the temperature of liquid nitrogen.

Figure 6:
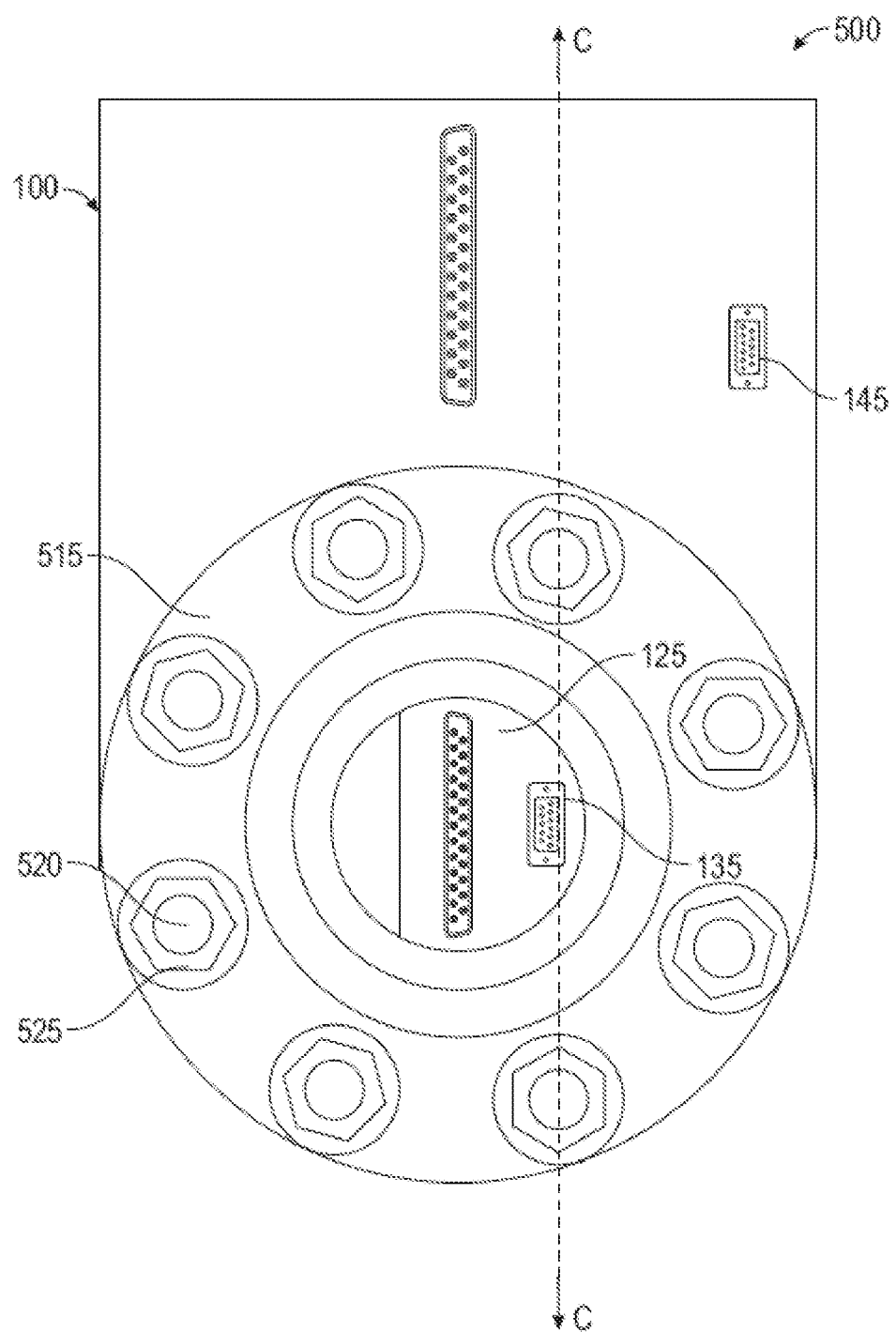
FIG. 6 is a front view of the first exemplary pressure interface board assembly of FIG. 1 installed on the exemplary pressure vessel of FIG. 5 with attachment pipe removed.

FIG. 6 is a front view of the pressure interface board assembly 100 of FIG. 1 installed on the exemplary pressure vessel 500 of FIG. 5 with the attachment pipe 510 removed. Thus, the inner portion 125 of the PCB 105 and the first and second inner connectors 135 and 140 are visible inside the interior opening of the connector flange 515. The inner aperture 115 allows passage of gas, liquid, or other substances through the connector flange 515 and thus between the attachment pipe 510 (when connected) and the main chamber 505 of the pressure vessel 500. Sensors or other components may be connected inside the interior volume of the pressure vessel 500 using the inner connectors 135 and 140, and the pressure interface board assembly 100 enables signals to be sent between the sensors or other components and equipment connected to the outer connectors 145 and 150.

Figure 7:
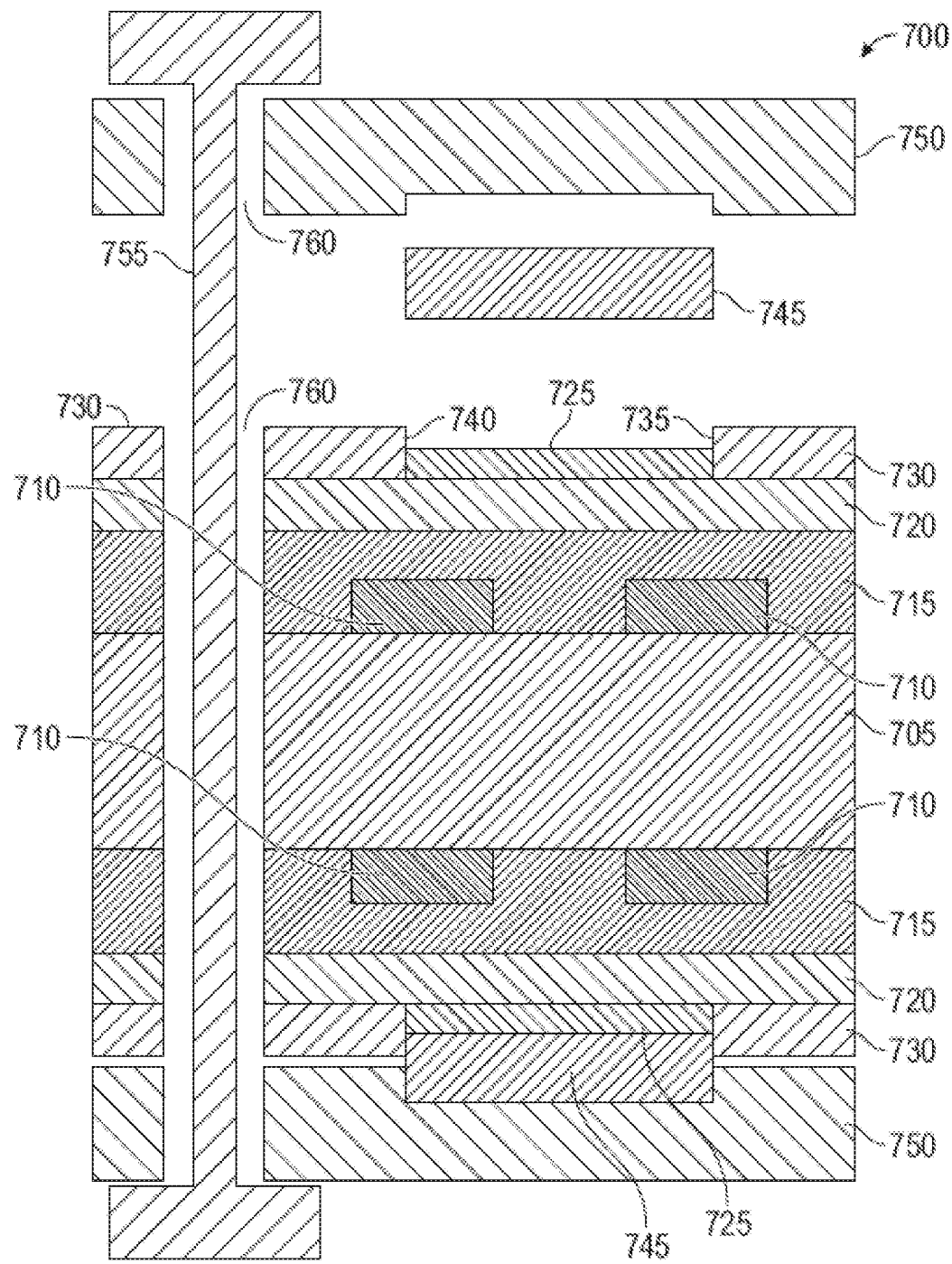
FIG. 7 is a cross-sectional illustration of the first exemplary pressure interface board assembly of FIG. 1 with the view taken along the reference lines A-A of FIG. 1.

FIG. 7 is a cross-sectional illustration of an exemplary pressure interface board assembly 700, such as the pressure interface board assembly 300 of FIG. 3 along section A-A. The pressure interface board assembly 700 includes a core substrate 705, which may be at least substantially planar. The core substrate 705 may be constructed, for example, and without limitation, from aluminum, a non-conductive composite material (e.g., FR4), or another suitable material.

Signal traces 710 are disposed on the core substrate 705. Although the signal traces 710 are shown only in the interior of the pressure interface board assembly 700 in this cross-sectional view, the signal traces 710 generally pass from the inner portion of the pressure interface board assembly 700 to the outer portion of the pressure interface board assembly 700. A non-conductive filler epoxy layer 715 encapsulates the signal traces 710 to protect and electrically isolate the signal traces 710 from one another and from other layers, which may be conductive in some implementations. A flat copper (or other material) layer 720 overlays the filler epoxy layer 715. The copper layer may provide a flat and smooth surface to cover and protect the signal traces. The copper surface may also provide a substrate for a hard-flat-metal finishing process. Additionally, the copper layer may also provide electrical shielding to isolate the signal traces from electromagnetic noise and may shield light from the outside of the vessel for applications in which having light leaking inside the vessel can be problematic. A hard, flat metal finishing layer 725 may be disposed on top of the copper layer 720 to provide a hard exterior surface and protect the interior layers of the pressure interface board assembly 700. In some implementations, a surface epoxy layer 730 may be disposed on top of at least a portion of the copper layer 720. The surface epoxy layer 730 may provide an inner lip 735 and an outer lip 740, which can serve to contain a gasket 745 and prevent the gasket 745 from splaying inward and outward under pressure when the gasket 745 and the pressure interface board assembly 700 are installed between faces of connector flanges 750 and tightened using a fastener 755. In this case, the metal finishing layer 725 may be contained between the inner lip 735 and the outer lip 740. The gasket 745 may be an O-ring, a flat gasket, or some other type of seal. As described above, the fastener 755 may be inserted through connection apertures 760 in the connector flanges 750 and the pressure interface board assembly 700.

The pressure interface board assembly 700 includes corresponding layers on each side of the core substrate 705. This construction may allow a greater density of signal traces 710 by allowing for signal traces 710 on both sides of the core substrate 705. In some implementations, the pressure interface board assembly 700 may be one-sided, such that the signal traces 710, filler epoxy 715, copper layer 720, and potentially other layers are disposed on only one side of the pressure interface board assembly 700. The various layers can be disposed directly or indirectly on the underlying layer. For example, and without limitation, additional intervening layers may be included without departing from the intended meaning of a particular layer being disposed on another layer. Certain layers may extend farther inwardly and outwardly along the plane of the core substrate 705 than other layers. For example, the core substrate 705 and the filler epoxy layers may extend to an outer periphery of the pressure interface board assembly 700, the signal traces 710 may extend between connectors (e.g., inner and outer connectors 135, 140, 145, and 150 of FIG. 1), and the copper layer 720 and surface epoxy layer 730 may extend over only a portion of the overall surface of the pressure interface board assembly 700 (e.g., between the second inner aperture 155 and second outer periphery 160 of FIG. 1). Generally, the copper layer 720 and/or the metal finishing layer 725 encircle an inner portion of the pressure interface board assembly 700 to provide a flat surface for purposes of creating a seal. In certain embodiments, the outer lip 740 may be outwardly disposed relative to the connector aperture 760 and the gaskets 745 may extend beyond the connector aperture 760. In this case, the gaskets 745 may include corresponding connector apertures to allow passage of the fastener 755 through the gaskets 745.

Figure 8:
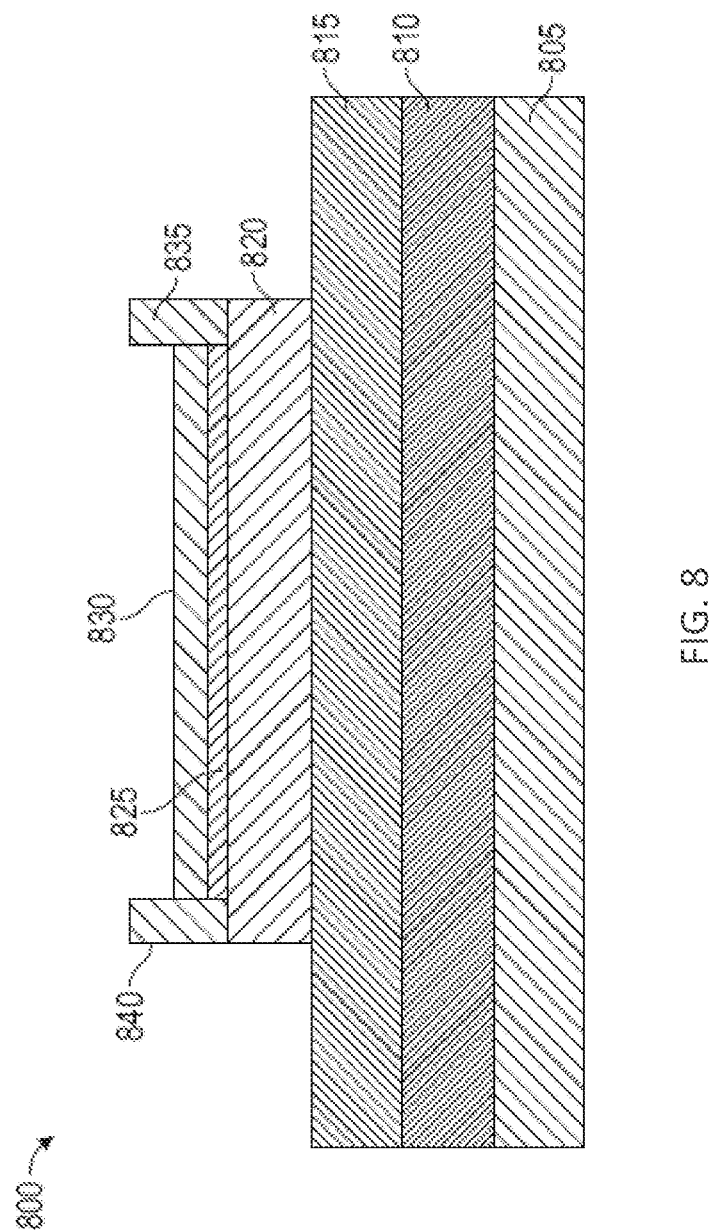
FIG. 8 is a cross-sectional illustration of the first exemplary pressure interface board assembly of FIG. 1 with the view taken along the reference lines B-B of FIG. 1.

FIG. 8 is a cross-sectional illustration of an exemplary alternative pressure interface board assembly 800, such as the pressure interface board assembly 100 of FIG. 1 along section B-B. The pressure interface board assembly 800 is similar to the pressure interface board assembly 700 of FIG. 7 but is single-sided. The pressure interface board assembly 800 includes a core substrate 805, signal traces 810 and a filler epoxy layer 815 that extend beyond the overlying layer, a copper layer 820, a metal finishing layer 825, a protective outer epoxy layer 830, and a narrow inner lip 835, and a narrow outer lip 840. The inner lip 835 and outer lip 840 may be constructed from any suitable material and provide a gasket containment surface that extends in an axial direction (e.g., perpendicular or otherwise projecting) from the exterior surface of the outer epoxy layer 830.

Figure 9:
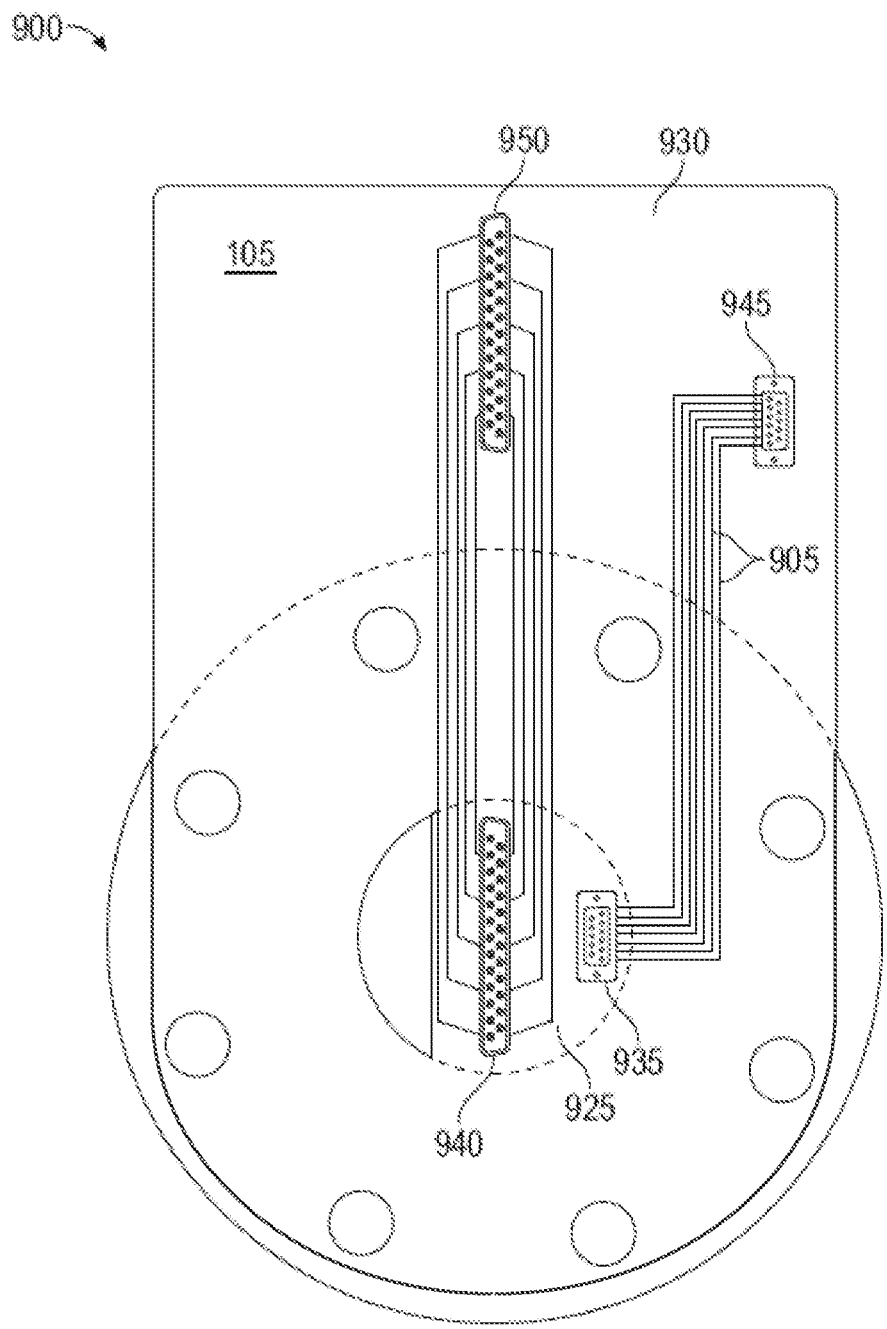
FIG. 9 is a front cutaway view of the printed circuit board (PCB) of the first exemplary pressure interface board assembly of FIG. 1 showing internal signal traces.

FIG. 9 is a top cutaway view 900 of the PCB 105 of FIG. 1 showing exemplary internal signal traces 905. A person of skill in the art will immediately recognize that the number of internal signal traces supported in certain embodiments of the present invention may vary with the connector components utilized and/or the PCB surface area available. The cutaway view 900 shows the PCB 105 with the exterior surface layers (e.g., the exterior metal layer 110) removed. The signal traces 905 extend from a first inner connector 935 and a second inner connector 940 on an inner portion 925 of the PCB 105 to a first outer connector 945 and a second outer connector 950 on an outer portion 930 of the PCB 105. As discussed above, the signal traces 905 are overlayed with an epoxy layer that protects and isolates the signal traces 905. The respective ends of the signal traces 905 extend upward through the epoxy layer to contact corresponding pins of the connectors 935, 940, 945, and 950. An exterior metal layer surrounding (e.g., encircling) the inner portion 925 of the PCB 105 overlays a portion of the epoxy layer between the inner portion 925 and outer portion 930 of the PCB 105 to provide a hard, flat contact for interfacing with a gasket or other seal.

Figure 10:
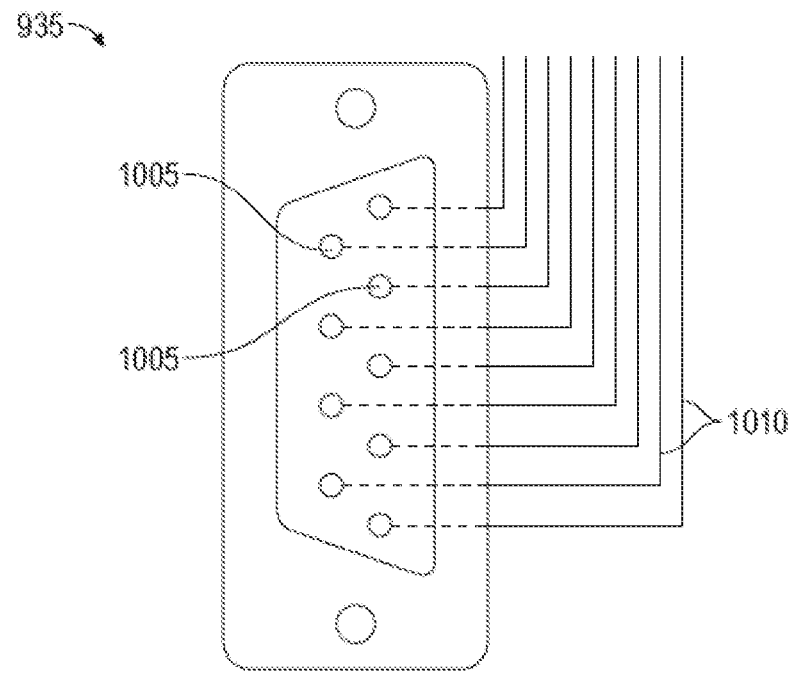
FIG. 10 is a close-up view of an inner connector of the PCB of FIG. 9.
Figure 11:
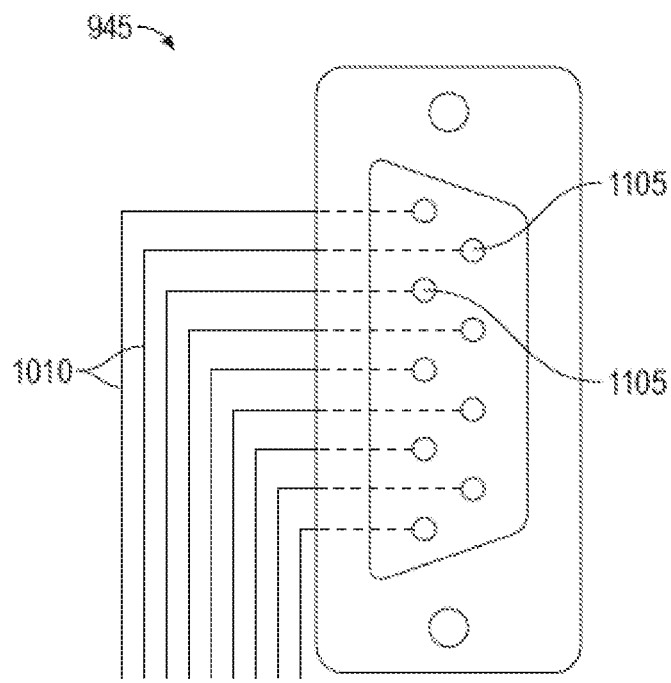
FIG. 11 is a close-up view of an outer connector of the PCB of FIG. 9.

FIG. 10 depicts a close-up view of an inner connector 935 and FIG. 11 depicts a close-up view of an outer connector 945 originally shown in FIG. 9. The inner connector 935 and the outer connector 945 are each multi-pin connectors and may be either male or female connectors. The multi-pin connectors include a plurality of pins 1005 and 1105. Each pin 1005 and 1105 is conductively connected to a corresponding signal trace 1010. Corresponding pins 1005 and 1105 on the inner connector 935 and the outer connector 945 are thus conductively connected to one another by a shared signal trace 1010. The inner connector 935 and the outer connector 945 are mounted on or attached to the PCB 105. In certain embodiments, the inner connector 935 and the outer connector 945 may not be identical. For example, and without limitation, such connectors may have different number of pins and/or be of different types. Some pins may be unused or not connected. In some implementations, one or more of the signal traces 1010 may be routed to a different connector than the generally corresponding inner connector 935 or outer connector 945.

Figure 12:
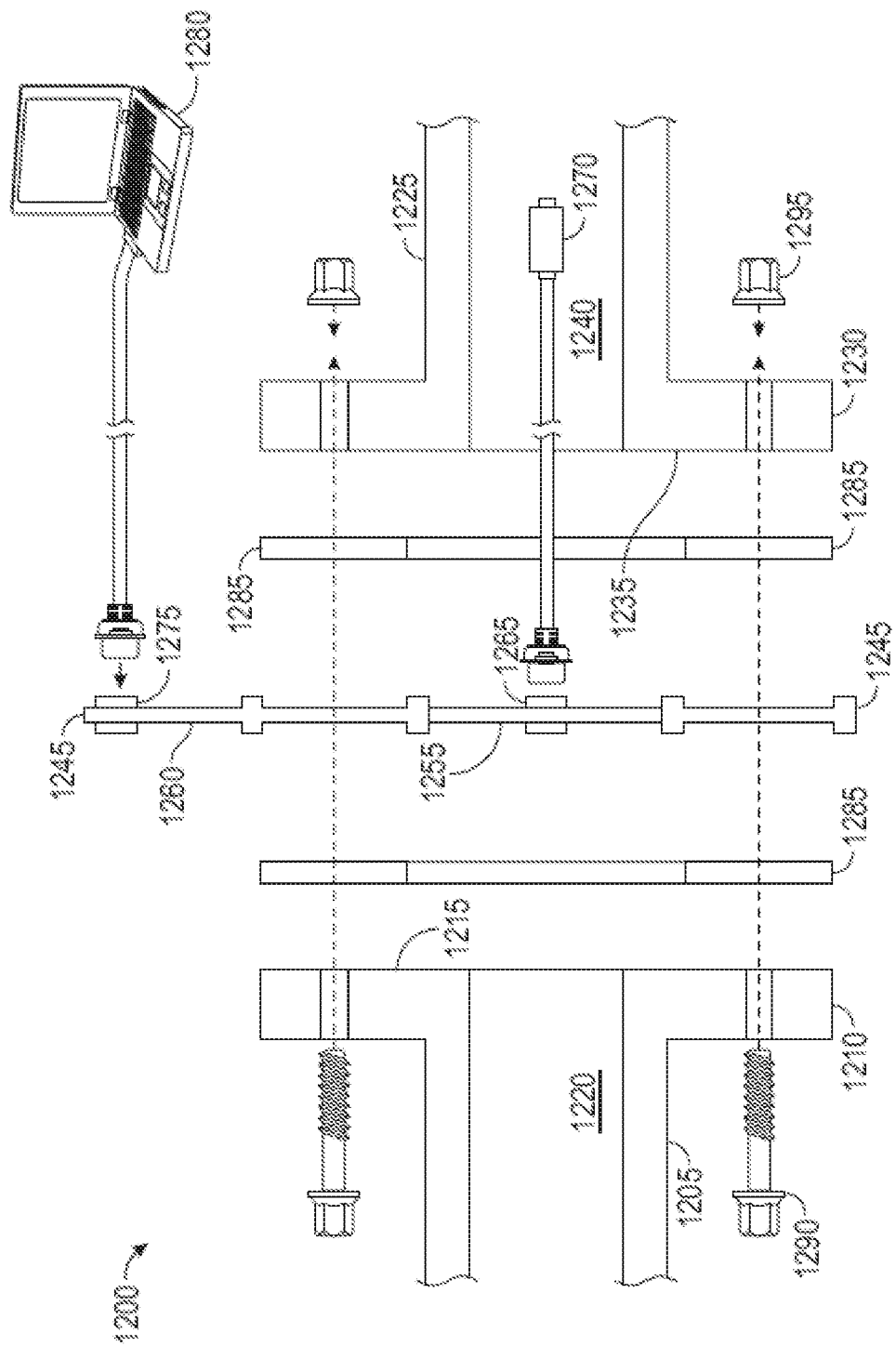
FIG. 12 is an exploded cross-sectional view of a pressure vessel sensor system employing the first exemplary pressure interface board assembly of FIG. 1 with the view taken along the reference lines C-C of FIGS. 5 and 6.

FIG. 12 is an exploded cross-sectional view of a pressure vessel sensor system 1200 along section C-C. The pressure vessel sensor system 1200 includes a pressure vessel 1205 having a vessel connector flange 1210 with a first flange face 1215 that internally opens into an interior volume 1220 of the pressure vessel 1205, and a pressure vessel attachment 1225 having an attachment connector flange 1230 with a second flange face 1235 that internally opens into an interior volume 1240 of the pressure vessel attachment 1225. A pressure interface board assembly 1245 includes an inner aperture (not visible in cross section, but similar in form and function to aperture 315 of FIGS. 3 and 4), an inner PCB portion 1255, and an outer PCB portion 1260. An inner connector 1265 on the inner PCB portion 1255 is adapted to connect to a sensor 1270 (or sensors) inside the interior volume 1240 of the pressure vessel attachment 1225 (and/or inside the interior volume 1220 of the pressure vessel 1205). Persons of ordinary skill will recognize that the interior volumes 1220 and 1240, when the pressure vessel sensor system 1200 is assembled, merge into a single interior volume due to the inner aperture. The sensor may include one or more sensing functions (e.g., pressure, temperature, chemical reactions, or other conditions inside the interior volume 1220 and 1240). An outer connector 1275 on the outer PCB portion 1260 is adapted to connect to control and/or monitoring equipment 1280 (e.g., a computing device) the interior volume 1240 of the pressure vessel attachment 1225 (and/or inside the interior volume 1220 of the pressure vessel 1205).

To assemble the pressure vessel sensor system 1200, the sensor 1270 is connected to the inner connector 1265 on the inner PCB portion 1255 and the control and/or monitoring equipment 1280 is connected to the outer connector 1275 on the outer PCB portion 1260. Gaskets 1285 are inserted between the pressure interface board assembly 1245 and each of the first flange face 1215 and the second flange face 1235. Bolts 1290 are inserted through holes in the connector flanges 1210 and 1230, the gaskets 1285, and the pressure interface board assembly 1245. The bolts 1290 are tightened down using a nut 1295 to create a seal around a circumference of the connector flanges 1210 and 1230, the gaskets 1285, and the pressure interface board assembly 1245. Thereafter, conditions inside the interior volume 1220 and 1240 can be monitored as a result of communications through the pressure interface board assembly 1245 between the sensor 1270 and the control and/or monitoring equipment 1280.

Figure 13:
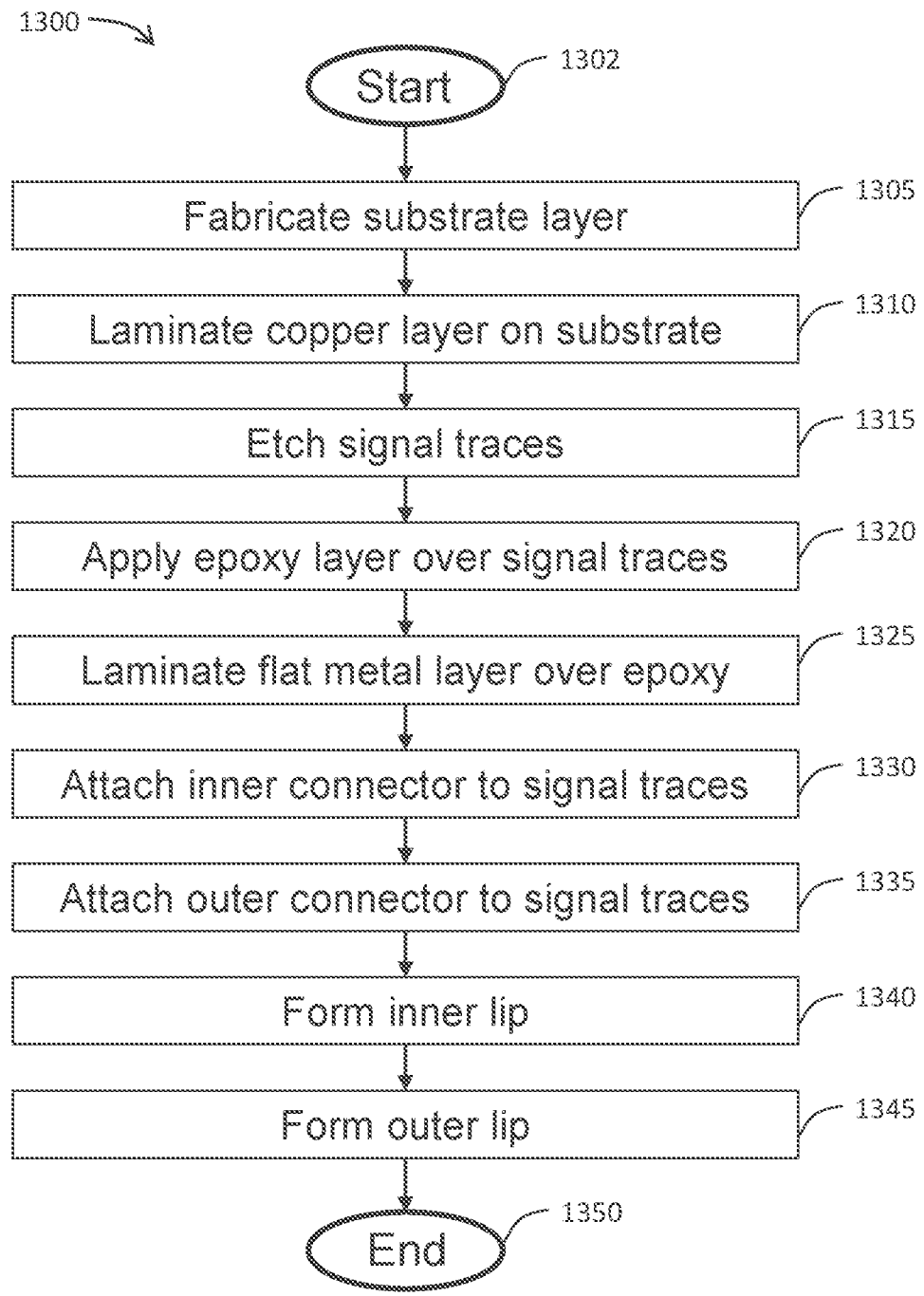
FIG. 13 is a flow diagram of a method of manufacturing a connector assembly according to an embodiment of the present invention.

FIG. 13 is a flow diagram of a method 1300 of manufacturing a connector assembly. A substrate layer having an inner aperture and an outer periphery is fabricated at 1305. A copper layer is laminated (e.g., through depositing copper or gluing a sheet of copper) on one or both sides of the substrate layer at 1310. One or more signal traces are etched from the copper layer at 1315. Each signal trace extends from a location on an inner portion of the substrate layer to a corresponding location on an outer portion of the substrate layer. A non-conductive epoxy layer is applied over the one or more signal traces at 1320. A substantially flat metal layer (or layers, e.g., one on each side) is laminated over the non-conductive epoxy layer(s) at 1325. The metal layer extends radially over at least a portion of a region between the respective locations on the inner portion of the substrate layer and the corresponding locations on the outer portion of the substrate layer. An inner connector is conductively attached to the one or more signal traces at the location on the inner portion of the substrate layer of each signal trace at 1330. An outer connector is conductively attached to the one or more signal traces at the location on the outer portion of the substrate layer of each signal trace at 1335. An inner raised lip projecting from the substantially flat metal layer and encircling the inner aperture is formed at 1340, and an outer raised lip projecting from the substantially metal layer is formed at an outwardly disposed location or circumference relative to the inner raised lip at 1345. The inner raised lip and the outer raised lip project from the substantially flat metal layer in a substantially axial direction.

Figure 14:
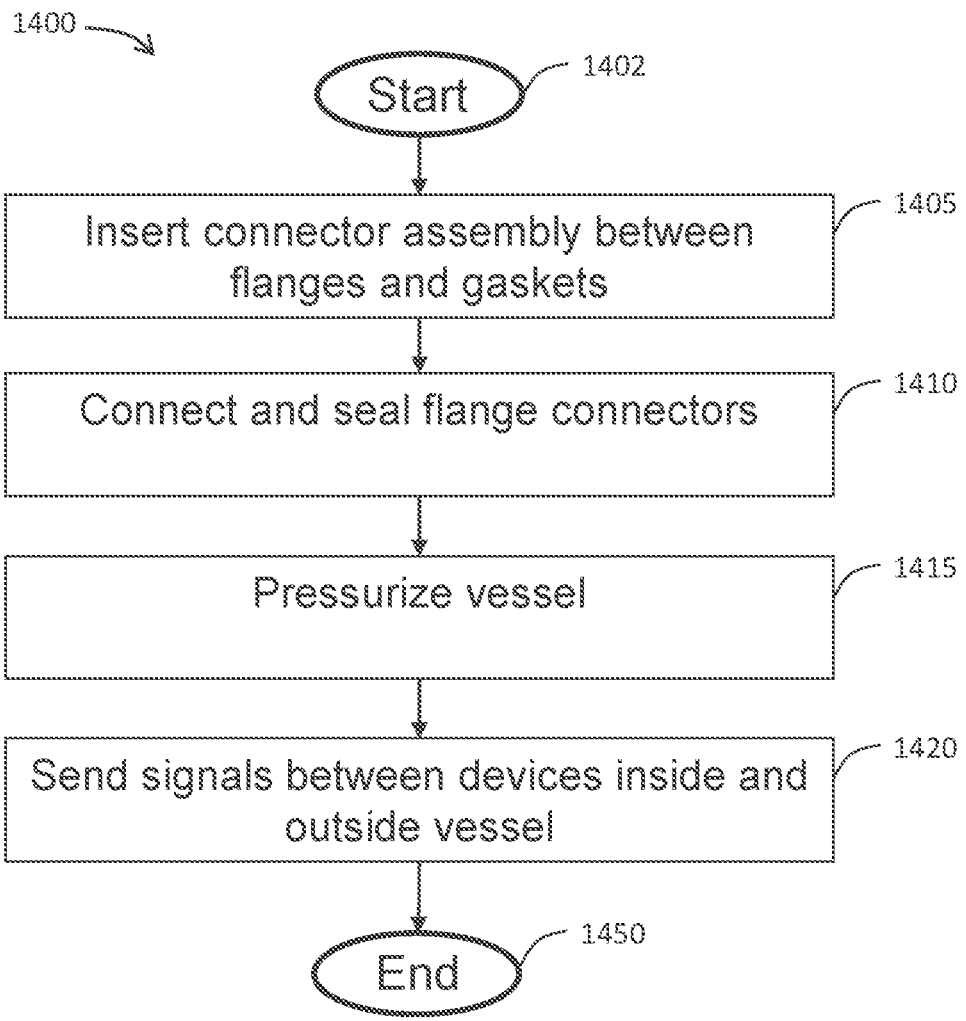
FIG. 14 is a flow diagram of a method of using an enclosed vessel according to an embodiment of the present invention.

FIG. 14 is a flow diagram of a method 1400 of using an enclosed vessel. A connector assembly (e.g., as described above) is inserted between a flange connector of an enclosed vessel and a gasket on one side of the connector assembly and a gasket and a flange connector of an attachment to the enclosed vessel on the other side of the connector assembly at 1405. The flange connector of the enclosed vessel and the flange connector of the attachment to the enclosed vessel are connected by applying a sufficient axial force to create a seal between the flange connector of the enclosed vessel, the connector assembly, and the flange connector of the attachment to the enclosed vessel using the gaskets and to isolate an interior volume of the enclosed vessel from an ambient environment at 1410. An internal volume of the enclosed vessel may be pressurized to a pressure different from the ambient environment at 1415. In this context, pressurization can include depressurization. Signals (e.g., control, data collection, etc.) are sent between a device connected to a connector inside of the enclosed vessel to a device connected to a connector outside of the enclosed vessel at 1420.

The apparatus, system and method according to an embodiment of the present invention may advantageously provide a flexible, reliable, and cost-effective alternative that can easily be installed in existing vessels with minimal or no modifications to the vessels.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus, the scope of the invention should be determined by the appended claims and their legal equivalents, and not by the examples given.

That which is claimed is:

1. A connector assembly comprising:
    a substrate layer having a first side, a second side, an inner aperture and an outer periphery outwardly disposed relative to the inner aperture;
    one or more signal traces disposed on the substrate, with each signal trace extending at least from a corresponding first location to a corresponding second location, wherein the second location is outwardly disposed relative to the first location;
    an inner connector conductively connected to at least one of the one or more signal traces at the first location of each signal trace;
    an outer connector conductively connected to at least one of the one or more signal traces at the second location of each signal trace;
    a first substantially flat exterior surface disposed on the substrate and extending radially over at least a portion of a region between the respective first locations and the respective second locations on the first side of the substrate layer; and
    a second substantially flat exterior surface disposed on the substrate and extending radially over at least a portion of a region between the respective first locations and the respective second locations on the second side of the substrate layer.

2. The connector assembly according to claim 1 further comprising one or more non-conductive epoxy layers encapsulating the one or more signal traces.

3. The connector assembly according to claim 2 further comprising:
    a first substantially flat hard layer disposed radially between the respective first locations and the respective second locations on the first side of the substrate layer, wherein a first non-conductive epoxy layer of the one or more the non-conductive epoxy layers is disposed between the substrate layer and the first substantially flat hard layer;
    a second substantially flat hard layer disposed radially between the respective first locations and the respective second locations on the second side of the substrate layer, wherein the substrate layer is disposed between the first non-conductive epoxy layer and the second substantially flat hard layer.

4. The connector assembly according to claim 3 wherein the first substantially flat hard layer comprises the first substantially flat exterior surface.

5. The connector assembly according to claim 3 further comprising:
    an inner raised lip projecting from the first substantially flat exterior surface and surrounding the inner aperture; and
    an outer raised lip projecting from the first substantially flat exterior surface and outwardly disposed relative to the inner raised lip, wherein the inner raised lip and the outer raised lip project from the first substantially flat exterior surface in a substantially axial direction.

6. The connector assembly according to claim 3 wherein:
    the first substantially flat hard layer and the second substantially flat hard layer include a second inner aperture larger than the inner aperture of the substrate layer and a second outer periphery smaller than the outer periphery of the substrate layer, such that a first portion of the substrate layer extends inwardly beyond an inner extent of the second inner aperture and a second portion of the substrate layer extends outwardly beyond an outer extent of the second outer periphery;

the first location of each of the one or more signal traces is disposed on the first portion of the substrate layer;

the second location of each of the one or more signal traces is disposed on the second portion of the substrate layer.

7. The connector assembly of claim 6 wherein the inner connector is mounted on the first portion of the substrate layer and the outer connector is mounted on the second portion of the substrate layer.

8. The connector assembly according to claim 7 further comprising:
   an inner raised lip projecting from the first substantially flat exterior surface and encircling the inner aperture; and
   an outer raised lip projecting from the first substantially flat exterior surface and outwardly disposed relative to the inner raised lip, wherein the inner raised lip and the outer raised lip project from the first substantially flat exterior surface in a substantially axial direction.

9. The connector assembly according to claim 1 wherein the one or more signal traces comprise a plurality of signal traces disposed on the first side of the substrate and a plurality of signal traces disposed on the second side of the substrate.

10. The connector assembly according to claim 1 further comprising a plurality of apertures outwardly disposed from the inner aperture, with each of the plurality of apertures adapted to allow passage of a fastener through a portion of the connector assembly.

11. The connector assembly according to claim 1 wherein the inner connector and the outer connector each comprise a multipin connector having a plurality of pins, with each pin conductively connected to a corresponding signal trace.

12. The connector assembly according to claim 1 wherein the substrate layer, the one or more signal traces, the first substantially flat exterior surface, and the second substantially flat exterior surface comprise a printed circuit board.

13. The connector assembly according to claim 1 wherein the connector assembly is adapted to be mounted between flanges of an enclosed vessel to provide a seal between an internal volume of the enclosed vessel and an exterior atmosphere of the enclosed vessel and to facilitate communication through the one or more signal traces between one or more components inside the enclosed vessel and one or more components outside of the enclosed vessel.

14. A system comprising:
   a pressure vessel having an interior, and exterior, and a first flange connector having a flange face and an aperture;
   a second flange connector having a flange face and an aperture;
   a connector assembly including:
      a substrate layer having a first side, a second side, an inner aperture and an outer periphery outwardly disposed relative to the inner aperture;
      one or more signal traces disposed on the substrate, with each signal trace extending at least from a corresponding first location to a corresponding second location, wherein the second location is outwardly disposed relative to the first location;
      an inner connector conductively connected to at least one of the one or more signal traces at the first location of each signal trace;
      an outer connector conductively connected to at least one of the one or more signal traces at the second location of each signal trace;
      a first substantially flat exterior surface disposed on the substrate and extending radially over at least a portion of a region between the respective first locations and the respective second locations on the first side of the substrate layer; and
      a second substantially flat exterior surface disposed on the substrate and extending radially over at least a portion of a region between the respective first locations and the respective second locations on the second side of the substrate layer;
   a first gasket disposed between the first flange connector and the connector assembly; and
   a second gasket disposed between the second flange connector and the connector assembly;
   wherein the first flange connector is connected to the second flange connector by one or more fasteners and the first flange connector, the first gasket, the connector assembly, the second gasket, and the second flange connector form a seal between a volume defined at least in part by the interior of the pressure vessel, the aperture of the first flange connector, the inner aperture of the connector assembly, and the second flange connector.

15. The system of claim 14 further comprising:
   a first component positioned in the volume; and
   a second component positioned in an external environment of the pressure vessel, wherein the first component and the second component are adapted to communicate using signals transmitted through the signal traces of the connector assembly.

16. A method of manufacturing a connector assembly, comprising:
   fabricating a substrate layer having a first side, a second side, an inner aperture and an outer periphery outwardly disposed relative to the inner aperture;
   laminating a copper layer on the first side of the substrate layer;
   etching one or more signal traces from the copper layer, with each signal trace extending at least from a corresponding first location to a corresponding second location, wherein the second location is outwardly disposed relative to the first location;
   applying a non-conductive epoxy layer over the one or more signal traces;
   laminating a substantially flat first metal layer over the non-conductive epoxy layer on the first side of the substrate layer, wherein the first metal layer extends radially over at least a portion of a region between the respective first locations and the respective second locations on the first side of the substrate layer;
   laminating a substantially flat second metal layer over the second side of the substrate layer, wherein the second metal layer extends radially over at least a portion of a region between the respective first locations and the respective second locations on the first side of the substrate layer;
   conductively attaching an inner connector to at least one of the one or more signal traces at the first location of each signal trace;
   conductively attaching an outer connector to at least one of the one or more signal traces at the second location of each signal trace.

17. The method according to claim 16 further comprising:
   forming an inner raised lip projecting from the first substantially flat metal layer and encircling the inner aperture; and forming an outer raised lip projecting from the first substantially metal layer and outwardly disposed relative to the inner raised lip, wherein the inner raised lip and the outer raised lip project from the first substantially flat metal layer in a substantially axial direction.

18. The method according to claim 16 further comprising:
laminating a second copper layer on the second side of the substrate layer;
etching one or more signal traces from the second copper layer, with each signal trace extending at least from a corresponding first location to a corresponding second location, wherein the second location is outwardly disposed relative to the first location; and
applying a second non-conductive epoxy layer over the one or more signal traces on the second side of the substrate layer;
wherein the substantially flat second metal layer on the second side of the substrate layer is laminated over the second non-conductive epoxy layer.

19. A method of using an enclosed vessel comprising:
inserting a connector assembly between a first flange connector of an enclosed vessel and a first gasket on a first side of the connector assembly and a second gasket and a second flange connector of an attachment to the enclosed vessel, wherein the connector assembly comprises:
a substrate layer having a first side, a second side, an inner aperture and an outer periphery outwardly disposed relative to the inner aperture;
one or more signal traces disposed on the substrate, with each signal trace extending at least from a corresponding first location to a corresponding second location, wherein the second location is outwardly disposed relative to the first location;
an inner connector conductively connected to at least one of the one or more signal traces at the first location of each signal trace;
an outer connector conductively connected to at least one of the one or more signal traces at the second location of each signal trace;
a first substantially flat exterior surface disposed on the substrate and extending radially over at least a portion of a region between the respective first locations and the respective second locations on the first side of the substrate layer; and
a second substantially flat exterior surface disposed on the substrate and extending radially over at least a portion of a region between the respective first locations and the respective second locations on the second side of the substrate layer;
connecting the first flange connector and the second flange connector by applying a sufficient axial force to create a seal between the first flange connector, the connector assembly, and the second flange connector using the first gasket and the second gasket and to isolate an interior volume of the enclosed vessel from an ambient environment; and
sending signals between a device connected to the first connector inside of the enclosed vessel to a device connected to the second connector outside of the enclosed vessel.

20. The method according to claim 19 further pressurizing an internal volume of the enclosed vessel to a pressure different from the ambient environment.

\* \* \* \* \*